US008869391B2

(12) United States Patent
Kamei et al.

(10) Patent No.: US 8,869,391 B2
(45) Date of Patent: Oct. 28, 2014

(54) PRODUCING METHOD OF WIRED CIRCUIT BOARD

(75) Inventors: Katsutoshi Kamei, Osaka (JP); Yuu Sugimoto, Osaka (JP); Hitoki Kanagawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 89 days.

(21) Appl. No.: 13/317,648

(22) Filed: Oct. 25, 2011

(65) Prior Publication Data

US 2012/0124829 A1 May 24, 2012

(30) Foreign Application Priority Data

Nov. 24, 2010 (JP) .................................. 2010-261515

(51) Int. Cl.
  *H05K 3/10* (2006.01)
  *H05K 3/42* (2006.01)
  *G11B 5/48* (2006.01)
  *H05K 1/05* (2006.01)

(52) U.S. Cl.
  CPC ...... *H05K 3/421* (2013.01); *H05K 2201/09509* (2013.01); *G11B 5/486* (2013.01); *H05K 2203/1105* (2013.01); *H05K 3/108* (2013.01); *H05K 1/056* (2013.01)
  USPC ................ 29/846; 29/592.1; 29/825; 29/829; 174/250; 361/748; 361/760; 361/777; 427/96.1; 427/96.5; 430/311; 430/315; 430/330

(58) Field of Classification Search
  USPC ................. 29/846, 592.1, 825, 829; 174/250; 361/748, 760, 777; 427/96.1–96.5, 427/97.8, 98.3, 98.5, 98.6, 98.9, 304, 314, 427/318, 299; 430/311, 315, 330; 438/584, 438/669
  See application file for complete search history.

(56) References Cited

U.S. PATENT DOCUMENTS 3,586,549 A * 6/1971 Gray ............................. 438/555
5,185,074 A * 2/1993 Yokoyama et al. .......... 205/162
(Continued)

FOREIGN PATENT DOCUMENTS

JP S62-145362 U 9/1987
JP 03-233991 A 10/1991
(Continued)

OTHER PUBLICATIONS

Notification of Reasons for Refusal issued by JPO on Oct. 1, 2013, in connection with corresponding Japanese Patent Application No. 2010-261515.
(Continued)

*Primary Examiner* — Peter DungBa Vo
*Assistant Examiner* — Azm Parvez
(74) *Attorney, Agent, or Firm* — Jean C. Edwards Esq.; Edwards Neils, PLLC (57) ABSTRACT

A method for producing a wired circuit board includes the steps of preparing a metal supporting layer, forming an insulating layer on the metal supporting layer so as to form an opening, forming a conductive thin film on the insulating layer and on the metal supporting layer that is exposed from the opening of the insulating layer, heating the conductive thin film, forming a conductive pattern on the conductive thin film that is formed on the insulating layer, and forming a metal connecting portion to be continuous to the conductive pattern on the conductive thin film that is formed on the metal supporting layer exposing from the opening of the insulating layer.

6 Claims, 8 Drawing Sheets

(56) References Cited

U.S. PATENT DOCUMENTS

| | | | |
|---|---|---|---|
| 7,790,612 B2* | 9/2010 | Nakamura et al. | 438/660 |
| 2005/0280944 A1 | 12/2005 | Yang et al. | |
| 2005/0282088 A1* | 12/2005 | Aonuma et al. | 430/311 |
| 2007/0172674 A1* | 7/2007 | Nozaki et al. | 428/458 |
| 2009/0020324 A1* | 1/2009 | Kamei et al. | 174/257 |
| 2010/0301342 A1* | 12/2010 | Nakamura et al. | 257/59 |

FOREIGN PATENT DOCUMENTS

| | | |
|---|---|---|
| JP | 2002-057437 | 2/2002 |
| JP | 2003-017837 A | 1/2003 |
| JP | 2004-031732 A | 1/2004 |
| JP | 2005-072063 A | 3/2005 |
| JP | 2005-240151 A | 9/2005 |
| JP | 2006-4599 A | 1/2006 |
| JP | 2006-012205 | 1/2006 |
| JP | 2006-198663 A | 8/2006 |
| JP | 2007-134564 A | 5/2007 |
| JP | 2007-242975 A | 9/2007 |
| JP | 2008-047843 A | 2/2008 |
| JP | 2009-212221 A | 9/2009 |

OTHER PUBLICATIONS

Notification of Reasons for Refusal issued by JPO on Mar. 18, 2014, in connection with corresponding JP2010-261515.

Decision of Refusal issued by JPO on Jun. 10, 2014 in connection with corresponding Japanese Patent Application No. 2010-261515.

* cited by examiner

PRODUCING METHOD OF WIRED CIRCUIT BOARD

CROSS-REFERENCE TO RELATED APPLICATION

The present application claims priority from Japanese Patent Application No. 2010-261515 filed on Nov. 24, 2010, the contents of which are hereby incorporated by reference into this application.

BACKGROUND OF THE INVENTION

1. Field of the Invention

The present invention relates to a producing method of a wired circuit board, to be specific, to a producing method of a wired circuit board that is preferably used as a suspension board with circuit.

2. Description of Related Art

A suspension board with circuit including a metal supporting board, an insulating base layer that is formed thereon, and a conductive pattern that is formed thereon has been known. The suspension board with circuit is mounted with a magnetic head and is used in a hard disk drive and the like. The conductive pattern is connected to the magnetic head and an external board, and an electrical signal is transmitted between the magnetic head and the external board via the conductive pattern.

In addition, there has been proposed the suspension board with circuit in which the conductive pattern is ground connected via a ground terminal that is conducted to the metal supporting board in order to reduce a noise caused by a difference in potential between the metal supporting board and the conductive pattern (ref: for example, Japanese Unexamined Patent Publication No. 2006-12205).

In the suspension board with circuit in Japanese Unexamined Patent Publication No. 2006-12205, the insulating base layer having a base opening is formed on the metal supporting board; next, a metal thin film (seed film) is formed on the metal supporting board that is exposed from the base opening; and subsequently, the ground terminal is formed on the metal thin film by a plating. That is, the ground terminal is formed on the metal supporting board via the metal thin film.

SUMMARY OF THE INVENTION

However, in the suspension board with circuit in Japanese Unexamined Patent Publication No. 2006-12205, adhesion between the metal thin film and the metal supporting board is insufficient, so that the ground terminal may peel off from the metal supporting board.

Above all, from the viewpoint of a high density arrangement of the conductive pattern, when the ground terminal is formed to be narrow, a contact area between the metal supporting board and the metal thin film is small. Therefore, it is necessary to improve the adhesion between the metal supporting board and the metal thin film.

It is an object of the present invention to provide a producing method of a wired circuit board that is capable of improving adhesion between a conductive thin film and a metal supporting layer and effectively preventing a peeling of a metal connecting portion from the metal supporting layer.

The method for producing a wired circuit board of the present invention includes the steps of preparing a metal supporting layer, forming an insulating layer on the metal supporting layer so as to form an opening, forming a conductive thin film on the insulating layer and on the metal supporting layer that is exposed from the opening of the insulating layer, heating the conductive thin film, forming a conductive pattern on the conductive thin film that is formed on the insulating layer, and forming a metal connecting portion to be continuous to the conductive pattern on the conductive thin film that is formed on the metal supporting layer exposing from the opening of the insulating layer.

In the method for producing the wired circuit board of the present invention, it is preferable that the step of heating the conductive thin film is performed before the step of forming the metal connecting portion.

In the method for producing the wired circuit board of the present invention, it is preferable that in the step of heating the conductive thin film, the conductive thin film is heated at 180 to 350° C. for 1 to 3 hours.

In the method for producing the wired circuit board of the present invention, it is preferable that in the step of forming the conductive thin film, the conductive thin film is formed to have a thickness in the range of 10 to 1000 nm.

In the method for producing the wired circuit board of the present invention, it is preferable that in the step of forming the conductive thin film, the conductive thin film is formed by a vacuum deposition and in the step of forming the metal connecting portion, the metal connecting portion is formed by a plating.

In the method for producing the wired circuit board of the present invention, it is preferable that in the step of forming the conductive pattern, the conductive pattern is formed so as to include a ground wire and a signal wire and in the step of forming the metal connecting portion, the metal connecting portion is formed so as to be continuous to the ground wire and to be independent from the signal wire.

In the method for producing the wired circuit board of the present invention, it is preferable that in the step of forming the conductive pattern, the conductive pattern is formed so as to include a plurality of the signal wires and in the step of forming the metal connecting portion, the metal connecting portion is formed so as to be continuous to the signal wires that are disposed at both sides of one piece of the signal wire and one pair of the metal connecting portions are formed so as to be conducted via the conductive thin film and the metal supporting layer.

According to the method for producing the wired circuit board of the present invention, the conductive thin film is heated, so that the adhesion between the conductive thin film and the metal supporting layer can be improved and therefore, the peeling of the metal connecting portion from the metal supporting layer can be effectively prevented.

Thus, the connection reliability between the metal connecting portion and the metal supporting layer can be improved.

BRIEF DESCRIPTION OF THE DRAWINGS

(a) illustrating a step of preparing a metal supporting layer,
(b) illustrating a step of forming an insulating base layer,
(c) illustrating a step of forming a conductive thin film, (d) illustrating a step of forming a plating resist, (e) illustrating a step of forming a conductive pattern and the ground connecting portion, (f) illustrating a step of removing the plating resist, (g) illustrating a step of removing the conductive thin film that is exposed from the conductive pattern and the ground connecting portion, and (h) illustrating a step of forming an insulating cover layer.

(a) illustrating a plan view and (b) illustrating a bottom view.

(a) illustrating a step of preparing the metal supporting layer, (b) illustrating a step of forming the insulating base layer, (c) illustrating a step of forming the conductive thin film, (d) illustrating a step of forming the plating resist, and (e) illustrating a step of forming the conductive pattern and the signal wire connecting portion.

(f) illustrating a step of removing the plating resist, (g) illustrating a step of removing the conductive thin film that is exposed from the conductive pattern and the ground connecting portion, (h) illustrating a step of forming a support opening and forming a support connecting portion, and (i) illustrating a step of forming the insulating cover layer.

DETAILED DESCRIPTION OF THE INVENTION

Figure 1:
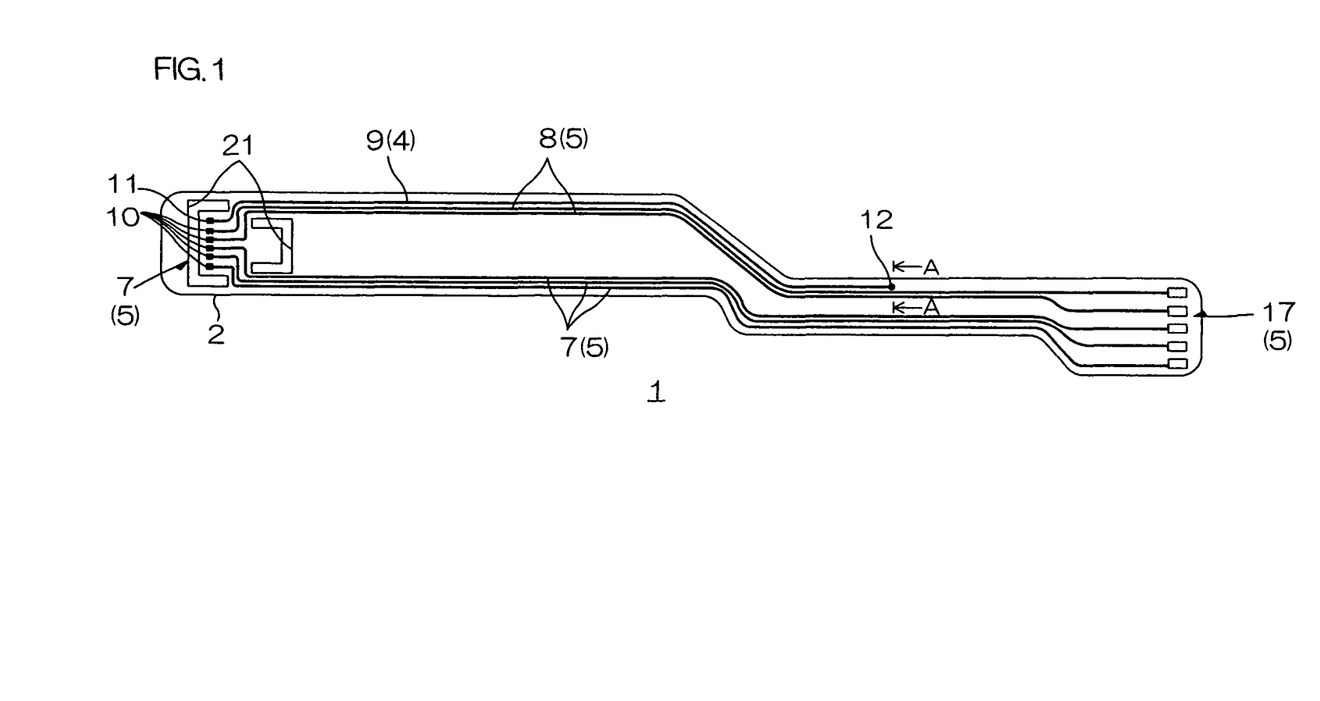
FIG. 1 shows a plan view of a suspension board with circuit obtained by one embodiment of a method for producing a wired circuit board of the present invention.
Figure 2:
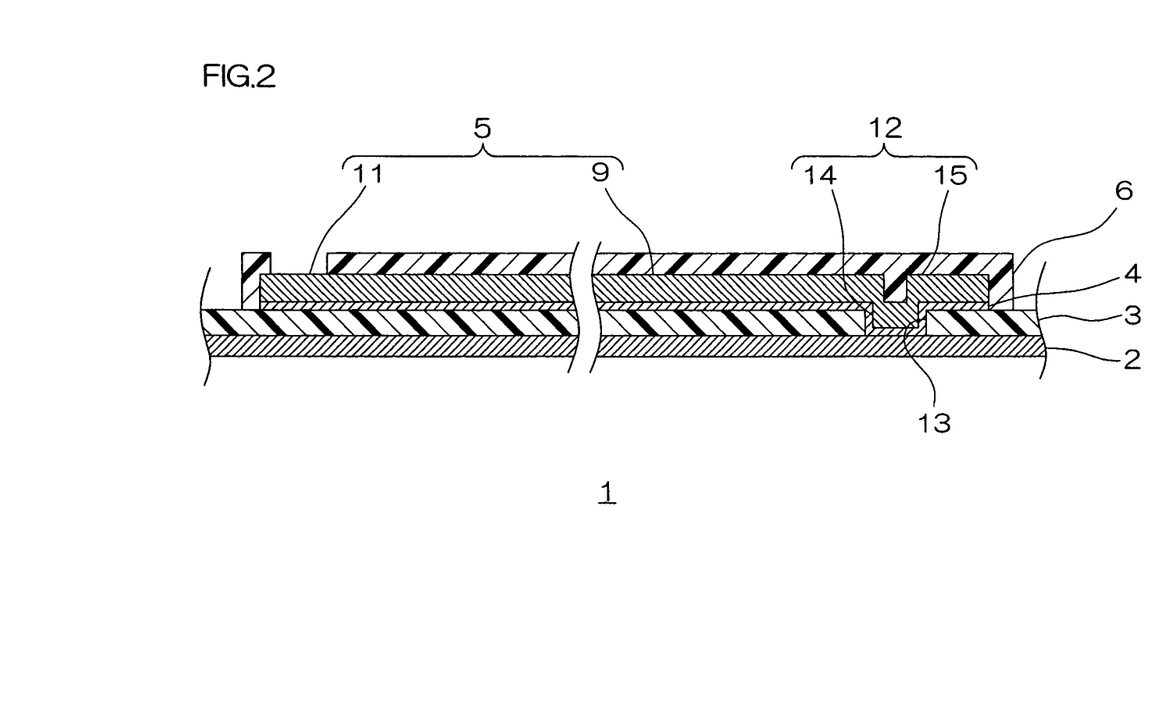
FIG. 2 shows a sectional view, taken along a signal wire of the suspension board with circuit shown in FIG. 1.
Figure 3:
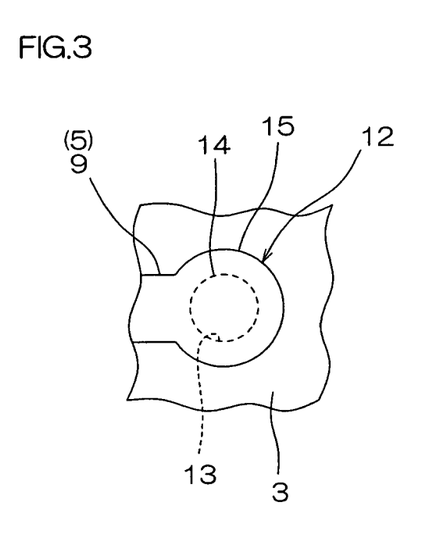
FIG. 3 shows an enlarged plan view of a ground connecting portion of the suspension board with circuit shown in FIG. 1.
Figure 4:
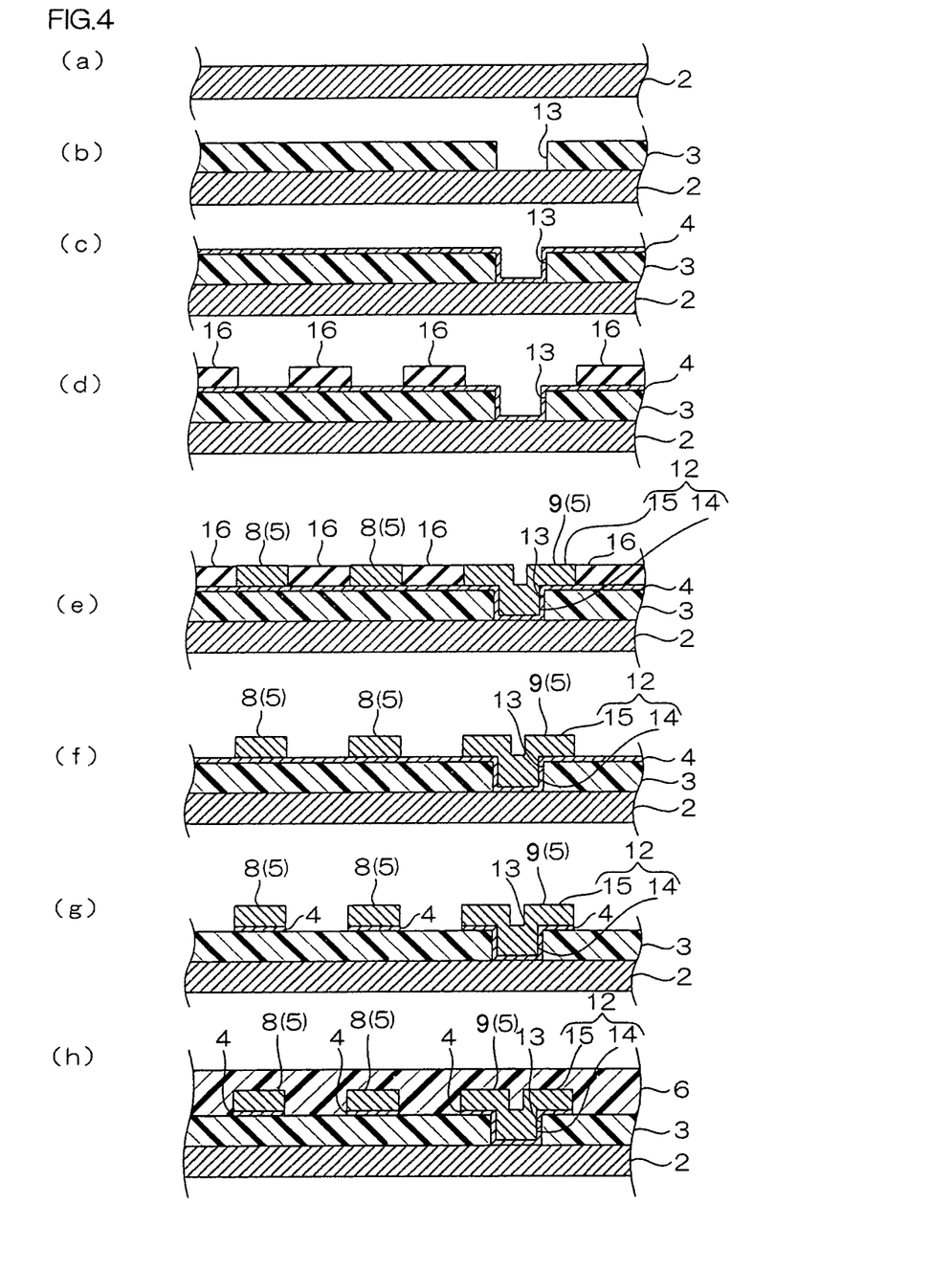
FIG. 4 shows process drawings for describing a method for producing the suspension board with circuit shown in FIG. 1 and a sectional view, taken along the line A-A in FIG. 1.

FIG. 1 shows a plan view of a suspension board with circuit obtained by one embodiment of a method for producing a wired circuit board of the present invention. FIG. 2 shows a sectional view, taken along a signal wire of the suspension board with circuit shown in FIG. 1. FIG. 3 shows an enlarged plan view of a ground connecting portion of the suspension board with circuit shown in FIG. 1. FIG. 4 shows process drawings for describing a method for producing the suspension board with circuit shown in FIG. 1 and a sectional view, taken along the line A-A in FIG. 1.

In FIGS. 1 and 3, an insulating cover layer 6 is omitted so as to clearly show the relative arrangement of a conductive pattern 5 and a ground connecting portion 12. In FIG. 1, an insulating base layer 3 is omitted so as to clearly show the shape of the ground connecting portion 12.

In FIG. 1, a suspension board with circuit 1 is mounted with a magnetic head (not shown) and an external board (not shown), and the suspension board with circuit 1 is mounted on a hard disk drive.

The suspension board with circuit 1 is formed into a flat belt shape extending in the lengthwise direction and includes a metal supporting layer 2 and the conductive pattern 5 supported by the metal supporting layer 2.

The metal supporting layer 2 is formed into a shape corresponding to a planar shape of the suspension board with circuit 1.

The conductive pattern 5 integrally includes a head-side terminal 7 that is formed on the front end portion (one end portion in the lengthwise direction) of the metal supporting layer 2, an external-side terminal 17 that is formed on the rear end portion (the other end portion in the lengthwise direction) of the metal supporting layer 2, and a signal wire 8 that electrically connects the head-side terminal 7 to the external-side terminal 17. The conductive pattern 5 includes a ground wire 9 that is electrically connected to the head-side terminal 7.

The head-side terminal 7 includes a signal terminal 10 that is connected to the signal wire 8 and a ground terminal 11 that is connected to the ground wire 9.

In the metal supporting layer 2, slits 21 that sandwich the head-side terminal 7 in the front-rear direction are formed so as to penetrate in the thickness direction.

As shown in FIGS. 2 and 4 (*h*), the suspension board with circuit 1 includes the metal supporting layer 2, the insulating base layer 3 that is formed on the metal supporting layer 2 as an insulating layer, a conductive thin film 4 that is formed on the insulating base layer 3, the conductive pattern 5 that is formed on the conductive thin film 4, and the insulating cover layer 6 that is formed on the insulating base layer 3 so as to cover the conductive pattern 5.

Examples of a metal material for forming the metal supporting layer 2 include stainless steel, 42-alloy, aluminum, copper-beryllium, or phosphor bronze. Preferably, stainless steel is used.

The metal supporting layer 2 has a thickness in the range of, for example, 15 to 50 µm, or preferably 20 to 30 µm.

The insulating base layer 3 is, on the upper surface of the metal supporting layer 2, formed into a pattern corresponding to the conductive pattern 5. In the insulating base layer 3, a base opening 13, as an opening, penetrating in the thickness direction, is formed in the middle of the front-rear direction. As shown in FIG. 3, the base opening 13 is formed into a generally circular shape in plane view. The base opening 13 is disposed at the position corresponding to the ground connecting portion 12 to be described later.

An example of an insulating material for forming the insulating base layer 3 includes a synthetic resin such as polyimide resin, polyamide imide resin, acrylic resin, polyether nitrile resin, polyether sulfone resin, polyethylene terephthalate resin, polyethylene naphthalate resin, and polyvinyl chloride resin. Preferably, polyimide resin is used.

The insulating base layer 3 has a thickness in the range of, for example, 1 to 35 µm, or preferably 3 to 33 µm.

As shown in FIGS. 2 and 4 (*h*), the conductive thin film 4 is formed so as to correspond to the conductive pattern 5 and the ground connecting portion 12 and is formed on the upper surface of the insulating base layer 3, on the inner side surfaces of the base opening 13 of the insulating base layer 3, and on the upper surface of the metal supporting layer 2 that is exposed from the base opening 13.

An example of a conductive material for forming the conductive thin film 4 includes a metal material such as chromium, copper, gold, silver, platinum, nickel, titanium, silicon, manganese, zirconium, alloys thereof, or oxide thereof. Preferably, chromium and copper are used. In addition, the conductive thin film 4 can also be formed of a plurality of layers that are formed of different metal materials.

The conductive thin film 4 has a thickness in the range of, for example, 10 to 1000 nm, or preferably 10 to 200 nm. When the thickness of the conductive thin film 4 is within the above-described range, adhesion between the conductive thin film 4 and the metal supporting layer 2 can be improved.

The conductive pattern 5 is formed on the upper surface of the conductive thin film 4 and as shown in FIG. 1, is formed as a wired circuit pattern including the head-side terminal 7, the external-side terminal 17, the signal wire 8, and the ground wire 9.

A plurality (six pieces) of the head-side terminals 7 are, on the front end portion of the suspension board with circuit 1, disposed at spaced intervals to each other in the widthwise direction. To be more specific, the head-side terminals 7 include five pieces of the signal terminals 10 and one piece of the ground terminal 11 that is disposed at one side in the widthwise direction thereof. Each of the head-side terminals 7 is formed into a generally rectangular shape in plane view that is long in the front-rear direction.

A plurality (five pieces) of the external-side terminals 17 are, on the rear end portion of the suspension board with circuit 1, disposed at spaced intervals to each other in the widthwise direction. Each of the external-side terminals 17 is formed into a generally rectangular shape in plane view that is long in the front-rear direction.

The signal wire 8 is formed so as to be continuous to the rear end portion of the signal terminal 10 and the front end portion of the external-side terminal 17.

The ground wire 9 is formed at one side in the widthwise direction of the signal wire 8 and is disposed at one side in the widthwise direction at a spaced interval to the signal wire 8 at the outermost portion of the one side in the widthwise direction.

In this way, the ground wire 9 is formed independently from the signal wire 8. That is, the ground wire 9 is electrically insulated from the signal wire 8.

The rear end portion of the ground wire 9 is connected to the ground connecting portion 12 as a metal connecting portion to be described later. The front end portion of the ground wire 9 is connected to the ground terminal 11.

Examples of the conductive material for forming the conductive pattern 5 and the ground connecting portion 12 include copper, nickel, gold, solder, or alloys thereof. Preferably, copper is used. The conductive pattern 5 has a thickness in the range of, for example, 3 to 50 μm, or preferably 5 to 20 μm.

Each of the head-side terminals 7 and each of the external-side terminals 17 have a width (a length in the widthwise direction) in the range of, for example, 20 to 1000 μm, or preferably 30 to 800 μm. A spacing between each of the head-side terminals 7 and a spacing between each of the external-side terminals 17 are in the range of, for example, 20 to 1000 μm, or preferably 30 to 800 μm.

Each of the signal wires 8 and the ground wire 9 have a width in the range of, for example, 5 to 200 μm, or preferably 8 to 100 μm. A spacing between each of the signal wires 8, and a spacing between the signal wire 8 at the most one side in the widthwise direction and the ground wire 9 are in the range of, for example, 5 to 200 μm, or preferably 8 to 100 μm.

As shown in FIGS. 2 and 4 (h), the insulating cover layer 6 is formed on the upper surface of the insulating base layer 3 that is exposed from the conductive pattern 5 and the ground connecting portion 12 to be described later, on the upper surface and the side surfaces of the signal wire 8, on the upper surface and the side surfaces of the ground wire 9, and on the upper surface and the side surfaces of the ground connecting portion 12. The insulating cover layer 6 is formed so as to expose the head-side terminal 7 and the external-side terminal 17.

The insulating material for forming the insulating cover layer 6 includes the same insulating material as that for forming the insulating base layer 3. The insulating cover layer 6 has a thickness in the range of, for example, 2 to 20 μm, or preferably 4 to 15 μm.

Next, the ground connecting portion 12 is described in detail.

As shown in FIG. 1, the ground connecting portion 12 is electrically connected to the rear end portion of the ground wire 9 in the middle of the front-rear direction of the suspension board with circuit 1. That is, the ground connecting portion 12 is formed independently from the signal wire 8.

As shown in FIG. 3, the ground connecting portion 12 is formed so as to correspond to the base opening 13 of the insulating base layer 3.

To be specific, as shown in FIGS. 2, 3, and 4 (h), the ground connecting portion 12 is formed into a generally circular shape in plane view, and continuously includes a lower portion 14 that is filled in the base opening 13 of the insulating base layer 3 and an upper portion 15 that covers the upper surface of the insulating base layer 3 around the base opening 13 from the upper end of the lower portion 14.

The lower portion 14 is filled in the base opening 13 so as to come into contact with the upper surface of the conductive thin film 4 that is formed on the upper surface of the metal supporting layer 2 exposing from the base opening 13 of the insulating base layer 3 and with the inner side surfaces of the conductive thin film 4 that is formed on the inner side surfaces of the base opening 13 of the insulating base layer 3.

The upper portion 15 is formed to be continuous on the lower portion 14 and on the upper surface of the conductive thin film 4 that is formed on the upper surface of the insulating base layer 3 around the base opening 13. The rear end portion of the ground wire 9 is continuous to the front end portion of the upper portion 15.

In this way, the ground connecting portion 12 is electrically connected to the metal supporting layer 2 via the conductive thin film 4 and is electrically connected to the ground wire 9 and the ground terminal 11. That is, the ground terminal 11 and the ground wire 9 are electrically connected (ground connected) to the metal supporting layer 2 via the ground connecting portion 12.

The upper portion 15 is covered by the insulating cover layer 6.

The lower portion 14 has a width and a length (the maximum diameter, the maximum inner diameter of the base opening 13) in the range of, for example, 0.01 to 1.0 mm, or preferably 0.05 to 0.5 mm. The lower surface of the lower portion 14 has an area in the range of, for example, $7.85 \times 10^{-5}$ to 0.785 mm$^2$, or preferably $1.96 \times 10^{-3}$ to 0.296 mm$^2$.

The upper portion 15 has a width and a length (the maximum diameter) in the range of, for example, 0.02 to 2.0 mm, or preferably 0.1 to 1.0 mm. The thickness of the upper portion 15 is the same as that of the conductive pattern 5.

Next, a method for producing the suspension board with circuit 1 is described with reference to FIG. 4.

As shown in FIG. 4 (a), in this method, the metal supporting layer 2 in a flat plate shape extending in the lengthwise direction is first prepared.

Next, as shown in FIG. 4 (b), the insulating base layer 3 is formed on the metal supporting layer 2 so as to form the base opening 13.

To form the insulating base layer 3, for example, a solution (varnish) of a photosensitive synthetic resin is applied onto the metal supporting layer 2 to form a photosensitive base film. Thereafter, the base film is exposed to light and is then developed to be formed into the above-described pattern and subsequently, is heat cured as required.

Next, as shown in FIG. 4 (c), the conductive thin film 4 is formed on the insulating base layer 3 and on the metal supporting layer 2 that is exposed from the base opening 13 of the insulating base layer 3.

To be specific, the conductive thin film 4 is formed to be continuous on the upper surface of the insulating base layer 3, on the inner side surfaces of the base opening 13 of the insulating base layer 3, and on the upper surface of the metal supporting layer 2 that is exposed from the base opening 13 of the insulating base layer 3.

An example of a method for forming the conductive thin film 4 includes a thin film forming method such as a vacuum deposition and a plating. Preferably, the vacuum deposition is used.

The vacuum deposition is the method in which, in a state where the environment of the suspension board with circuit 1 in the process of the production is set to be in a vacuum atmosphere, the above-described conductive material is vaporized to be adhered onto the entire upper surface of the metal supporting layer 2 including the insulating base layer 3.

In the vacuum deposition, the conductive thin film 4 can be formed with the above-described desired thickness and can be formed with a stable thickness.

Examples of the vacuum deposition include a sputter deposition (sputtering), a resistance heating deposition, an electron beam heating deposition, and an ion plating. Preferably, the sputtering is used.

Preferably, the sputtering in which a chromium sputtering and a copper sputtering are sequentially performed is used.

Thereafter, in this method, the suspension board with circuit 1 in the process of the production is heated.

In this way, the conductive thin film 4 is heated, so that the adhesion between the conductive thin film 4 and the metal supporting layer 2 can be improved.

The heating temperature is in the range of, for example, 180° C. or more, preferably 180 to 350° C., or more preferably 200 to 300° C. The heating duration is in the range of, for example, 1 to 3 hours, or preferably 1 to 2 hours.

When the heating temperature and the heating duration are above the above-described range, in a case where the conductive thin film 4 is made of a plurality of layers that are formed of different metal materials (to be specific, in a case where the conductive thin film 4 is made of a lower layer formed of chromium and an upper layer laminated thereon and formed of copper), the metal material (chromium) of the lower layer enters the upper layer, for example, by heating, so that the lamination (precipitation) of the ground connecting portion 12 by the plating (described later) performed thereafter on the upper surface of the upper layer may be impaired. On the other hand, when the heating temperature and the heating duration are below the above-described range, there may be a case where the adhesion between the conductive thin film 4 and the metal supporting layer 2 in the base opening 13 cannot be sufficiently improved.

The heating is performed, for example, under an atmosphere containing oxygen such as air, for example, under a vacuum (the presence of a low concentration of oxygen) atmosphere, or for example, under an inert gas, such as nitrogen, atmosphere. Preferably, the heating is performed under the vacuum atmosphere or under the inert gas atmosphere.

Next, as shown in FIGS. 4 (d) to 4 (g), the conductive pattern 5 is formed on the conductive thin film 4 that is formed on the insulating base layer 3 with the above-described pattern corresponding to the head-side terminal 7, the external-side terminal 17, the signal wire 8, and the ground wire 9. At the same time, the ground connecting portion 12 is formed to be continuous to the ground wire 9 on the conductive thin film 4 that is formed on the metal supporting layer 2 exposing from the base opening 13 of the insulating base layer 3 and on the insulating base layer 3 around the base opening 13.

To form the conductive pattern 5 and the ground connecting portion 12, a known patterning method such as an additive method is used.

In the additive method, as shown in FIG. 4 (d), a plating resist 16 is first formed on the upper surface of the conductive thin film 4 in a pattern reverse to that of the conductive pattern 5 and the ground connecting portion 12.

Next, as shown in FIG. 4 (e), the conductive pattern 5 is formed on the upper surface of the conductive thin film 4 that is exposed from the plating resist 16. At the same time, the ground connecting portion 12 is formed on the upper surface (the upper surface of the conductive thin film 4 that is formed on the upper surface of the metal supporting layer 2 exposing from the base opening 13 and the upper surface of the conductive thin film 4 that is formed on the upper surface of the insulating base layer 3 around the base opening 13) and on the inner side surfaces (the inner side surfaces of the conductive thin film 4 that is formed on the inner side surfaces of the base opening 13 of the insulating base layer 3) of the conductive thin film 4 that is exposed from the plating resist 16.

An example of the method for forming the conductive pattern 5 and the ground connecting portion 12 includes a plating such as an electrolytic plating. With the plating, the conductive pattern 5 and the ground connecting portion 12 can be formed with the above-described desired thickness.

Next, as shown in FIG. 4 (f), the plating resist 16 is removed, for example, by an etching, a peeling, or the like.

Next, as shown in FIG. 4 (g), the conductive thin film 4 that is exposed from the conductive pattern 5 and the ground connecting portion 12 is removed, for example, by a soft etching.

In the soft etching, the conductive pattern 5 and the ground connecting portion 12 serve as an etching resist and are not removed by the soft etching. Alternatively, the thickness of the conductive pattern 5 and the ground connecting portion 12 is sufficiently thicker than that of the conductive thin film 4, so that the conductive pattern 5 and the ground connecting portion 12 are not substantially removed.

In this way, the conductive pattern 5 and the ground connecting portion 12 are formed on the conductive thin film 4.

Next, as shown in FIG. 4 (h), the insulating cover layer 6 is formed on the insulating base layer 3 so as to cover the conductive pattern 5 and the ground connecting portion 12. For example, a photosensitive synthetic resin is applied onto the insulating base layer 3 including the conductive pattern 5 and the ground connecting portion 12 to form a photosensitive cover film. Thereafter, the cover film is exposed to light and is then developed to be formed into the above-described pattern and subsequently, is heat cured as required.

Thereafter, though not shown, a metal plating layer is formed on the upper surfaces of the head-side terminal 7 and the external-side terminal 17 as required. The metal plating layer is made of, for example, gold and/or nickel and has a thickness in the range of, for example, 0.01 to 1 μm.

Thereafter, the slit 21 (ref: FIG. 1) is formed by, for example, the etching, a drill boring, or a laser processing. At the same time with this, the metal supporting layer 2 is cut out along an outer shape thereof.

The suspension board with circuit 1 is obtained in this manner.

Thereafter, a magnetic head (not shown) is connected to the head-side terminal 7 and the ground connecting portion 12, and an external board (not shown) is connected to the external-side terminal 17.

An electrical signal is transmitted between the magnetic head and the external board via the signal terminal 10, the signal wire 8, and the external-side terminal 17, and a part of the magnetic head is ground connected via the ground terminal 11, the ground wire 9, and the ground connecting portion 12.

According to the above-described method, the conductive thin film 4 is heated, so that the adhesion between the conductive thin film 4 and the metal supporting layer 2 can be improved and therefore, the peeling of the ground connecting portion 12 from the metal supporting layer 2 can be effectively prevented.

Thus, the connection reliability between the ground connecting portion 12 and the metal supporting layer 2 can be improved.

In addition, a noise caused by a difference in potential between the metal supporting layer 2 and the conductive pattern 5 (the signal wire 8) can be reduced.

In the above-described description, the heating of the conductive thin film 4 is performed before the formation of the conductive pattern 5 and the ground connecting portion 12 shown in FIG. 4 (g), to be more specific, before the formation of the plating resist 16 shown in FIG. 4 (d). However, the time of the heating is not particularly limited to this. Alternatively, for example, the heating of the conductive thin film 4 can be performed after the formation of the conductive pattern 5 and the ground connecting portion 12 shown in FIG. 4 (g) and before the formation of the insulating cover layer 6 shown in FIG. 4 (h), or at the same time with the formation thereof (to be more specific, at the same time with the heating by curing for forming the insulating cover layer 6), or furthermore, after the formation thereof.

When the conductive thin film 4 is heated after the formation of the conductive pattern 5 and the ground connecting portion 12, the inhibition of the precipitation in the plating can be prevented in a case where the ground connecting portion 12 is formed by the plating.

That is, when the conductive thin film 4 is made of a chromium thin film and a copper thin film that is formed thereon, there may be a case where the chromium is moved onto the upper surface of the copper thin film by heating (to be specific, the heating above 350° C.). When the ground connecting portion 12 is attempted to be formed by the plating thereafter, the precipitation of the plating layer (the ground connecting portion 12) is impaired by the chromium on the upper surface of the copper thin film.

However, when the conductive thin film 4 is heated after the formation of the conductive pattern 5 and the ground connecting portion 12, the ground connecting portion 12 is already formed by the plating at the time of the heating, so that the above-described inhibition of the precipitation in the plating can be avoided.

Therefore, the peeling of the ground connecting portion 12 with respect to the metal supporting layer 2 can be prevented.

When the conductive thin film 4 is heated at the same time with the formation of the insulating cover layer 6 shown in FIG. 4 (h), the heating of those can be performed at the same time, so that the production processes can be reduced.

Preferably, the conductive thin film 4 is heated before the formation of the conductive pattern 5 and the ground connecting portion 12 shown in FIG. 4 (g). By heating the conductive thin film 4 before the formation of the ground connecting portion 12, the peeling of the conductive thin film 4 from the metal supporting layer 2 can be prevented due to the stress in electrodeposits at the time of the plating.

In the above-described embodiment in FIG. 3, the ground connecting portion 12 is formed into a generally circular shape in plane view. However, the planar shape thereof is not particularly limited and can also be formed into, for example, a generally rectangular shape in plane view and the like.

Figure 5:
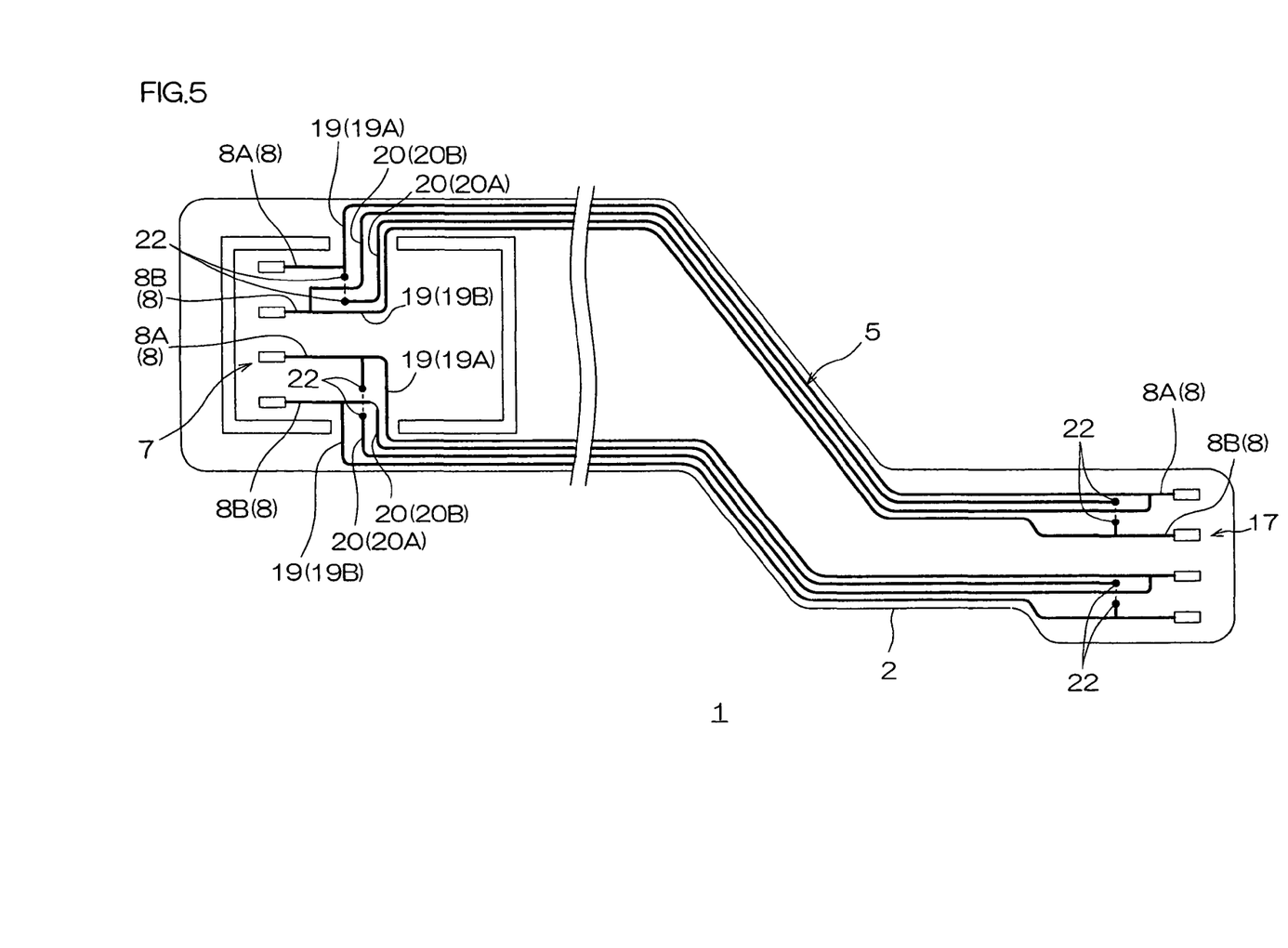
FIG. 5 shows a plan view of the suspension board with circuit obtained by another embodiment of the method for producing the wired circuit board of the present invention.
Figure 6:
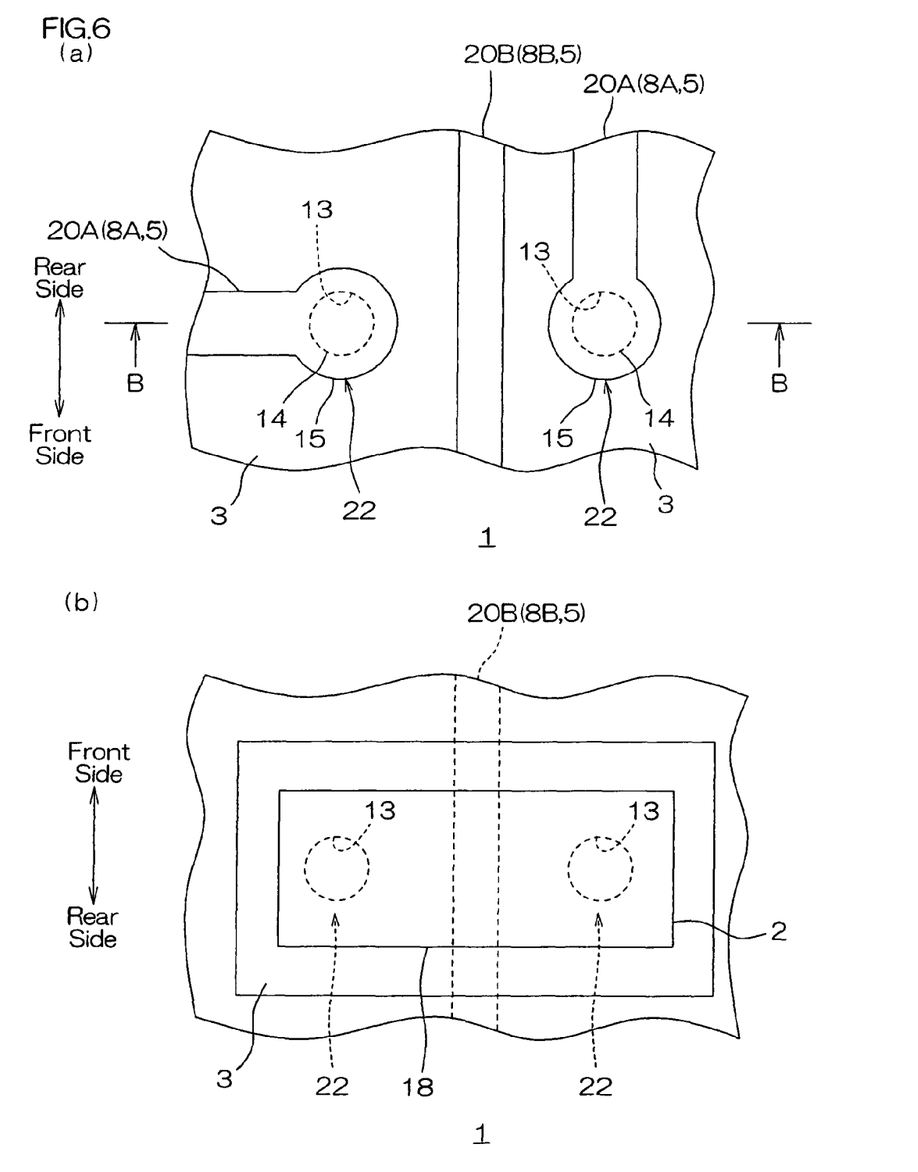
FIG. 6 shows an enlarged view of a signal wire connecting portion of the suspension board with circuit shown in FIG. 5.
Figure 7:
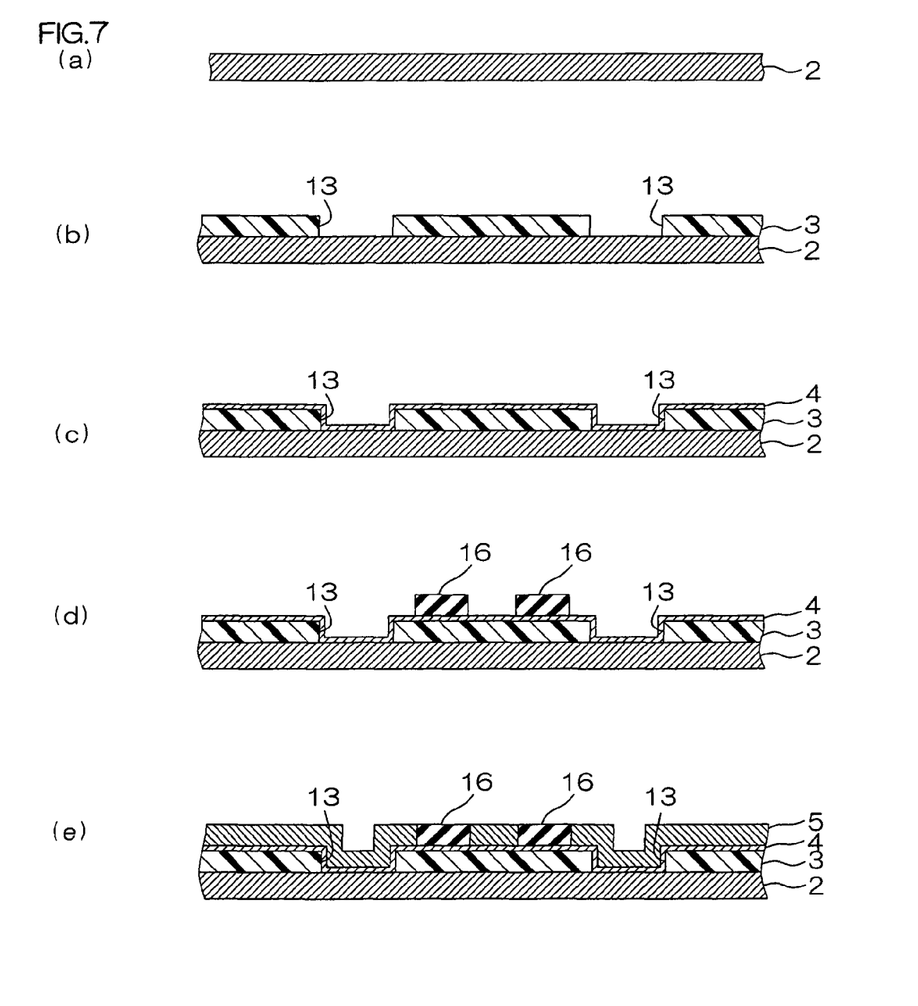
FIG. 7 shows process drawings for describing a method for producing the suspension board with circuit shown in FIG. 5 and a sectional view, taken along the line B-B in FIG. 6 (*a*)
Figure 8:
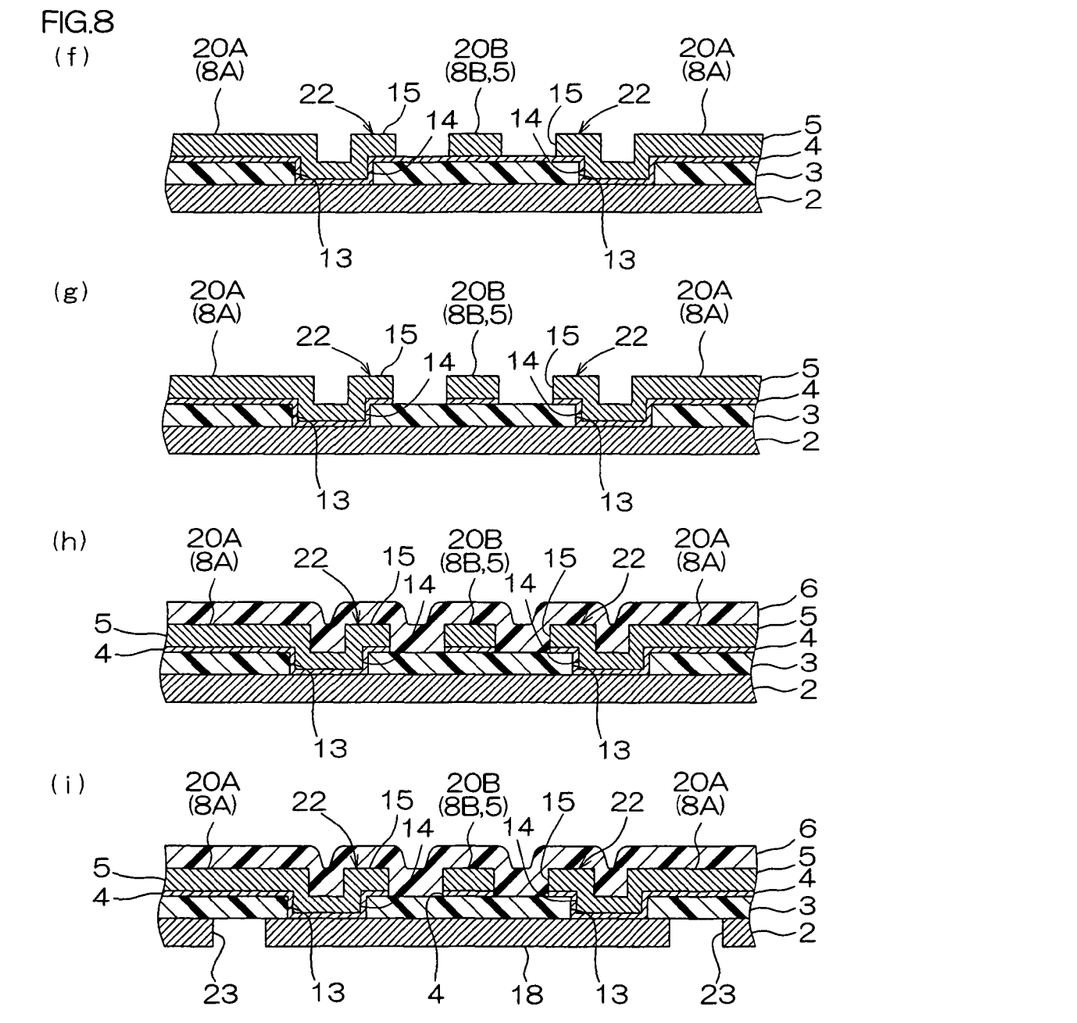
FIG. 8 shows process drawings for describing a method for producing the suspension board with circuit shown in FIG. 5 and a sectional view, taken along the line B-B in FIG. 6 (*a*), subsequent to FIG. 7.

FIG. 5 shows a plan view of the suspension board with circuit obtained by another embodiment of the method for producing the wired circuit board of the present invention. FIG. 6 shows an enlarged view of a signal wire connecting portion of the suspension board with circuit shown in FIG. 5. FIGS. 7 and 8 show process drawings for describing a method for producing the suspension board with circuit shown in FIG. 5.

In each figure to be described below, the same reference numerals are provided for members corresponding to each of those described above, and their detailed description is omitted.

In the above-described embodiments in FIGS. 1 to 4, the metal connecting portion of the present invention is described as the ground connecting portion 12. Alternatively, for example, as shown in FIGS. 5 to 8, the metal connecting portion of the present invention can be defined as a signal wire connecting portion 22 for electrically connecting the signal wire 8.

In FIG. 5, the conductive pattern 5 includes two pairs of the signal wires 8, the head-side terminals 7 that are connected to the front end portions of the signal wires 8, and the external-side terminals 17 that are connected to the rear end portions of the signal wires 8.

Each of the signal wires 8 includes a first wire 19 and a second wire 20 that is connected to the first wire 19.

The second wire 20 branches off from the front side portion of the first wire 19 to be connected (joined) to the rear side portion of the first wire 19. In the front end portion of the suspension board with circuit 1, a second wire 20A of one piece of signal wire 8A in one pair of the signal wires 8 on one side is, when projected in the thickness direction, formed so as to intersect with a second wire 20B of the other signal wire 8B that is next to one piece of the signal wire 8A.

To be specific, as shown in FIGS. 5 and 6, in the front end portion of the suspension board with circuit 1, two pieces of the signal wire connecting portions 22 are formed in the middle of the second wire 20A.

The signal wire connecting portion 22 is disposed at the both widthwise sides of the second wire 20B of the other signal wire 8B at spaced intervals thereto. Each of the signal wire connecting portions 22 is formed into a generally circular shape in plane view.

As shown in FIGS. 6 (a), 6 (b), and 8 (i), the base opening 13 corresponding to the signal wire connecting portion 22 is formed in the insulating base layer 3.

The signal wire connecting portion 22 integrally includes the lower portion 14 that is filled in the base opening 13 and the upper portion 15 that protrudes from the upper end of the lower portion 14 toward the upper side and the outer side. The upper portion 15 is formed so as to be continuous to the second wire 20A.

In the metal supporting layer 2, a support opening 23 penetrating in the thickness direction is formed. The support opening 23 is formed into a generally rectangular frame shape in bottom view that is long in the widthwise direction and is formed so as to surround the two pieces of the signal wire connecting portions 22.

In the metal supporting layer 2, at the inner side of the support opening 23, a support connecting portion 18 that is divided by the support opening 23 is formed. The support connecting portion 18 is formed into a generally rectangular shape in bottom view that is long in the widthwise direction and is formed so as to pass over the second wire 20B of the other signal wire 8B in the widthwise direction. The support connecting portion 18 is disposed at the inner side of the metal supporting layer 2 around the support opening 23 at spaced intervals thereto. In this way, the support connecting portion 18 is electrically insulated from the metal supporting layer 2 around the support opening 23.

The support connecting portion 18 is, at the both widthwise end portions, in contact with the conductive thin film 4 that is formed on the lower surfaces of the lower portions 14 of the two pieces of the signal wire connecting portions 22.

In this way, one pair of the signal wire connecting portions 22 are electrically connected to each other via the conductive thin film 4 and the support connecting portion 18. That is, the middle portion of the second wire 20A of one piece of the signal wire 8A is electrically connected (conducted) via the signal wire connecting portion 22, the conductive thin film 4, and the support connecting portion 18.

In the rear end portion of the suspension board with circuit 1, one pair of the signal wire connecting portions 22 are formed in the second wire 20B of the other signal wire 8B in one pair of the signal wires 8 on one side. The middle portion thereof is electrically connected (conducted) via the signal wire connecting portion 22, the conductive thin film 4, and the support connecting portion 18.

In addition, each of the signal wire connecting portions 22 is formed in one pair of the signal wires 8 on the other side in the same manner as described above.

To obtain the suspension board with circuit 1, as shown in FIG. 7 (*a*), the metal supporting layer 2 is prepared.

Next, as shown in FIG. 7 (*b*), the insulating base layer 3 is formed on the metal supporting layer 2 so as to form the base opening 13.

Next, as shown in FIG. 7 (*c*), the conductive thin film 4 is formed on the insulating base layer 3 and on the metal supporting layer 2 that is exposed from the base opening 13 of the insulating base layer 3.

Next, as shown in FIGS. 7 (*d*), 7 (*e*), 8 (*f*), and 8 (*g*), the conductive pattern 5 is formed on the conductive thin film 4 that is formed on the insulating base layer 3 with the above-described pattern. And the signal wire connecting portion 22 is formed on the conductive thin film 4 that is formed on the metal supporting layer 2 exposing from the base opening 13 of the insulating base layer 3.

That is, as shown in FIG. 7 (*d*), the plating resist 16 is first formed on the upper surface of the conductive thin film 4 in a pattern that is reverse to that of the conductive pattern 5 and the signal wire connecting portion 22.

Next, as shown in FIG. 7 (*e*), the conductive pattern 5 is formed on the upper surface of the conductive thin film 4 that is exposed from the plating resist 16. At the same time, the signal wire connecting portion 22 is formed on the upper surface and on the inner side surfaces of the conductive thin film 4 that is exposed from the plating resist 16.

Next, as shown in FIG. 8 (*f*), the plating resist 16 is removed.

Subsequently, as shown in FIG. 8 (*g*), the conductive thin film 4 that is exposed from the conductive pattern 5 and the signal wire connecting portion 22 is removed.

Next, as shown in FIG. 8 (*h*), the insulating cover layer 6 is formed on the insulating base layer 3 so as to cover the conductive pattern 5 and the signal wire connecting portion 22.

Thereafter, as shown in FIG. 8 (*i*), the slit 21 (ref: FIG. 1) and the support opening 23 are formed in the metal supporting layer 2. The support connecting portion 18 is formed by the formation of the support opening 23.

In the suspension board with circuit 1, the second wires 20 (20A and 20B) are formed so as to be conducted via one pair of the signal wire connecting portions 22, the conductive thin film 4, and the support connecting portion 18, so that a characteristic impedance in the conductive pattern 5 can be reduced.

The adhesion between the conductive thin film 4 below the signal wire connecting portion 22 and the support connecting portion 18 can be improved and therefore, the peeling of the signal wire connecting portion 22 from the support connecting portion 18 can be effectively prevented.

In each of the embodiments described above, the wired circuit board of the present invention is described as the suspension board with circuit 1. Alternatively, for example, though not shown, the wired circuit board of the present invention can be produced as a flexible wired circuit board including the metal supporting layer 2 as a reinforcing layer.

EXAMPLE

While the present invention will be described hereinafter in further detail with reference to Examples and Comparative Example, the present invention is not limited to these Examples and Comparative Example.

Example 1

A metal supporting layer made of stainless steel having a thickness of 25 μm was prepared (ref: FIG. 4 (*a*)). Next, an insulating base layer made of polyimide having a thickness of 10 μm was formed on the metal supporting layer so as to form a base opening (ref: FIG. 4 (*b*)). The base opening was formed into a generally circular shape in plane view with an inner diameter of 0.6 mm and an area of 0.28 $mm^2$.

Next, a conductive thin film having a thickness of 100 nm was formed to be continuous on the upper surface of the insulating base layer, on the inner side surfaces of the base opening of the insulating base layer, and on the upper surface of the metal supporting layer that was exposed from the base opening of the insulating base layer (ref: FIG. 4 (*c*)).

To be specific, first, a chromium thin film having a thickness of 30 nm was formed to be continuous on the entire upper surface of the insulating base layer, on the inner side surfaces of the base opening of the insulating base layer, and on the upper surface of the metal supporting layer that was exposed from the base opening by a chromium sputtering.

Subsequently, a copper thin film having a thickness of 70 nm was formed on the surface (the upper surface and the side surfaces) of the chromium thin film by a copper sputtering.

Thereafter, a suspension board with circuit in the process of the production was heated at 200° C. for one hour under a vacuum atmosphere.

Next, a plating resist was formed on the upper surface of the conductive thin film in a pattern that is reverse to that of a conductive pattern and a ground connecting portion (ref: FIG. 4 (*d*)).

Next, the conductive pattern having a thickness of 20 μm was formed on the upper surface of the conductive thin film that was exposed from the plating resist by an electrolytic copper plating. At the same time with this, the ground connecting portion was formed on the upper surface and on the inner side surfaces of the conductive thin film 4 that was exposed from the plating resist (ref: FIG. 4 (*e*)). The ground connecting portion was formed, in a circular shape in plane view, so as to have an upper portion and a lower portion so that the lower portion was filled in the base opening and the upper portion was connected to a ground wire. The ground connecting portion was formed into a generally circular shape in plane view. The upper portion thereof had a thickness of 20 μm and a diameter of 1.2 mm.

Next, the plating resist was removed by an etching (ref: FIG. 4 (f)).

Next, the conductive thin film that was exposed from the conductive pattern and the ground connecting portion was removed by a soft etching in which the conductive pattern and the ground connecting portion served as an etching resist (ref: FIG. 4 (g)).

Subsequently, an insulating cover layer made of polyimide having a thickness of 5 μm was formed on the insulating base layer so as to cover the conductive pattern and the ground connecting portion (ref: FIG. 4 (h)).

Thereafter, a slit was formed by the etching and at the same time, the metal supporting layer was cut out along an outer shape thereof (ref: FIG. 1).

The suspension board with circuit was obtained in this manner.

Example 2

A suspension board with circuit was obtained by being processed in the same manner as in Example 1 except that the heating temperature of the conductive thin film was changed to 250° C.

Example 3

A suspension board with circuit was obtained by being processed in the same manner as in Example 1 except that the heating of the conductive thin film was performed after the formation of the conductive pattern and the ground connecting portion; the heating temperature was changed to 380° C.; and the heating duration was changed to three hours.

Comparative Example 1

A suspension board with circuit was obtained by being processed in the same manner as in Example 1 except that the conductive thin film was not heated.

(Evaluation)
(Peel Test)

A peel test at 90° C. (peeling speed: 25 mm/min) was performed as follows: in a state where an adhesive tape was attached onto the entire upper surface of the suspension board with circuit in Examples 1 to 3 and Comparative Example 1 (the suspension board with circuit before the insulating cover layer was formed) and the suspension board with circuit was fixed, the adhesive tape was peeled off.

In this way, the peeling force of the ground connecting portion with respect to the metal supporting layer was evaluated.

The results are shown in Table 1.

TABLE 1

|  | Examples | | | Comparative Example Comparative |
|---|---|---|---|---|
|  | Example 1 | Example 2 | Example 3 | Example 1 |
| Heating Temperature of Conductive Thin Film (° C.) | 200 | 250 | 380 | — |
| Peeling Intensity (g/cm) | 229 | 249 | 390 | 129 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method of producing a wired circuit board, comprising the steps of:
    preparing a metal supporting layer,
    forming an insulating layer on the metal supporting layer so as to form an opening,
    forming a conductive thin film on the insulating layer and on the metal supporting layer that is exposed from the opening of the insulating layer,
    heating the conductive thin film prior to formation of a plating resist for forming a conductive pattern and a metal connecting portion,
    forming the plating resist on an upper surface of the conductive thin film in a pattern reverse to that of the conductive pattern and the metal connecting portion to be formed,
    forming the conductive pattern on the conductive thin film that is formed on the insulating layer, and
    forming the metal connecting portion to be continuous to the conductive pattern on the conductive thin film that is formed on the metal supporting layer that is exposed from the opening of the insulating layer,
    wherein in the step of heating the conductive thin film, the conductive thin film itself is heated at 180 to 350° C. for 1 to 3 hours, thereby to improve an adhesion between the metal thin film and the metal supporting layer and prevent a peeling of the metal connecting portion from the metal supporting layer.

2. The method of producing the wired circuit board according to claim 1, wherein in the step of forming the conductive thin film, the conductive thin film is formed to have a thickness in the range of 10 to 1000 nm.

3. The method of producing the wired circuit board according to claim 1, wherein in the step of forming the conductive thin film, the conductive thin film is formed by a vacuum deposition and in the step of forming the metal connecting portion, the metal connecting portion is formed by a plating.

4. The method of producing the wired circuit board according to claim 1, wherein in the step of forming the conductive pattern, the conductive pattern is formed so as to include a ground wire and a signal wire and in the step of forming the metal connecting portion, the metal connecting portion is formed so as to be continuous to the ground wire and to be independent from the signal wire.

5. The method of producing the wired circuit board according to claim 1, wherein in the step of forming the conductive pattern, the conductive pattern is formed so as to include a plurality of the signal wires and in the step of forming the metal connecting portion, the metal connecting portion is formed so as to be continuous to the signal wires that are disposed at both sides of one piece of the signal wire and one pair of the metal connecting portions are formed so as to be conducted via the conductive thin film and the metal supporting layer.

6. The method of producing the wired circuit board according to claim 1,
    wherein the step of forming the insulating layer is the step of forming the insulating layer by heat-curing, and
    wherein the step of forming the conductive thin film is the step of forming the conductive thin film on the insulating layer and on the metal supporting layer that is exposed from the opening of the insulating layer after forming the insulating layer by heat-curing.

* * * * *